United States Patent
Lee

(10) Patent No.: US 7,767,580 B2
(45) Date of Patent: Aug. 3, 2010

(54) SEMICONDUCTOR DEVICE AND METHOD OF FABRICATING THE SAME

(75) Inventor: Han Choon Lee, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 911 days.

(21) Appl. No.: 11/495,387

(22) Filed: Jul. 27, 2006

(65) Prior Publication Data
US 2007/0032057 A1 Feb. 8, 2007

(30) Foreign Application Priority Data
Jul. 27, 2005 (KR) .................. 10-2005-0068323

(51) Int. Cl.
*H01L 21/4763* (2006.01)
*H01L 21/44* (2006.01)
(52) U.S. Cl. ..................... 438/682; 438/656
(58) Field of Classification Search ............ 438/682, 438/656
See application file for complete search history.

(56) References Cited
U.S. PATENT DOCUMENTS

| 6,323,130 | B1 * | 11/2001 | Brodsky et al. | 438/682 |
| 6,787,425 | B1 * | 9/2004 | Rotondaro et al. | 438/300 |
| 7,109,116 | B1 * | 9/2006 | Purtell et al. | 438/682 |
| 7,320,938 | B2 * | 1/2008 | Purtell et al. | 438/682 |
| 2002/0111021 | A1 * | 8/2002 | Paton et al. | 438/682 |
| 2005/0272262 | A1 * | 12/2005 | Kim | 438/682 |
| 2006/0121660 | A1 * | 6/2006 | Rhee et al. | 438/197 |
| 2007/0020929 | A1 * | 1/2007 | Purtell et al. | 438/682 |

OTHER PUBLICATIONS

Van Zant, Microchip Fabrication, A Practical Guide to Semicondctor Processing, 2004, McGraw-Hill, Fifth Edition, p. 365-400.*

* cited by examiner

*Primary Examiner*—Alexander G Ghyka
(74) *Attorney, Agent, or Firm*—The Law Offices of Andrew D. Fortney; Andrew D. Fortney

(57) ABSTRACT

A method for fabricating a semiconductor device, including forming a gate insulating layer and a gate electrode on a substrate; forming insulating layer sidewalls at sides of the gate electrode; forming source/drain regions in surface portions of the substrate that are located, respectively, at sides of the gate electrode; forming a conductive silicide layer on the entire surface of the substrate; and selectively removing the silicide layer from areas other than the gate electrode and the source/drain regions of the substrate. The conductive silicide layer may be made by forming a silicon layer on an entire surface of the substrate; forming a conductive layer on the silicon layer; and thermal-processing the substrate such that the conductive layer reacts with the silicon layer.

20 Claims, 6 Drawing Sheets

SEMICONDUCTOR DEVICE AND METHOD OF FABRICATING THE SAME

BACKGROUND OF THE INVENTION

1. Field of the Invention

The present invention relates to a semiconductor device, and particularly, to a semiconductor device and a method of fabricating the same to form a metal silicide layer having a stable resistance characteristic by compensating for a loss of silicon.

2. Description of the Related Art

In general, as a semiconductor device becomes geometrically smaller, gate, source and drain regions are decreasing in size, and a junction between the source region and the drain region needs to be shallower. However, for these reasons, high-resistance regions are undesirably generated.

Accordingly, to reduce the resistance between the source and drain regions and a polycrystalline silicon region, a high melting point metal silicide is used on contacts between those regions.

Whenever contacts between the source and drain regions and the exposed silicon occur during processes, a thin film of high melting point metal is deposited and heated to form a silicide. In this process, various silicide compounds including platinum, manganese, cobalt, titan, or the like are used.

A method of fabricating a related art semiconductor device will now be described referring to accompanying drawings.

FIGS. 1A to 1F are cross-sectional views illustrating a method of fabricating the related art semiconductor device.

As shown in FIG. 1A, a semiconductor substrate 21 includes active regions and device isolation regions, and device isolation layers 22 are formed in the device isolation regions through a local oxidation of silicon (LOCOS) or shallow trench isolation (STI) process.

Then, the semiconductor substrate 21 is thermally oxidized at a high temperature to form a gate oxidation layer 23 on the semiconductor substrate 21.

As shown in FIG. 1B, n-type or p-type impurity ions for forming a channel of a transistor are selectively implanted in the active region of the semiconductor substrate 21 to form an n-well or p-well (not shown), and a thermal process is performed thereon at a high temperature of about 1050~1200° C.

Then, a polysilicon layer is deposited on the gate oxidation layer 23, and the polysilicon layer and the gate oxidation layer 23 are selectively etched through a photolithography process, to form a gate electrode 24.

N-type impurity ions or p-type impurity ions are implanted to an entire surface of the semiconductor substrate 21, using the gate electrode 24 as a mask, to form lightly doped drain (LDD) regions 25 in surface portions of the semiconductor substrate 21 that are located at both sides of the gate electrode 24, respectively.

As shown in FIG. 1C, an insulating layer is deposited on an entire surface of the semiconductor substrate 21 by a low pressure chemical vapor deposition (LPCVP) method, and then an etch-back process is performed on the entire surface thereof to form insulating layer sidewalls 26 at both sides of the gate electrode 24.

Then, n-type or p-type high-concentration impurity ions are implanted to the entire surface of the semiconductor substrate 21 using the gate electrode 24 and the insulating layer sidewalls 26 as a mask, to form source-drain impurity regions 27 in surface portions of the semiconductor substrate 21 that are located, respectively, at both sides of the gate electrode 24, and then a thermal process is performed thereon at a temperature of about 1000~1050° C.

As shown in FIG. 1D, a washing process is performed to remove from the semiconductor substrate 21 various target materials such as metal impurities, organic contaminants, natural oxidation layer.

Then, the semiconductor substrate 21 having passed through the washing process is transferred to a sputter chamber (not shown) of sputtering equipment, and a nickel layer 28 is formed on the entire surface of the semiconductor substrate 21 by sputtering.

As shown in FIG. 1E, the semiconductor substrate 21 is provided into rapid thermal process (RTP) equipment or an electric furnace and is thermally processed at a temperature of 400~600° C., to form a nickel silicide layer 29 on the surface of the semiconductor substrate 21 including the gate electrode 24 and the source and drain impurity regions 27.

Specifically, during the thermal process, silicon ions of the gate electrode 24 and the semiconductor substrate 21 react with nickel ions of the nickel layer 28, thereby forming the nickel silicide layer 29. However, such a reaction does not occur in the insulating layer sidewalls 26 and the device isolation layers 22, and thus the nickel layer 28 still remains thereon.

As shown in FIG. 1F, the remaining nickel layer 28 that does not participate in the formation of the nickel silicide layer 29 is removed, and then the semiconductor substrate 21 is annealed at a predetermined temperature to stabilize a phase of the nickel silicide layer 29, thereby completing a low-resistance nickel silicide layer 29.

However, the related art method of fabricating a semiconductor device has the following problems.

Because nickel silicide (NiSi) is formed within such a narrow temperature range, temperature deviation from the temperature range by only about 10° C. causes a material such as $Ni_2Si$ or $NiSi_2$ that has high resistance to be generated.

Therefore, a nickel silicide (NiSi) needs to be formed even at a low temperature.

SUMMARY OF THE INVENTION

Accordingly, the present invention is directed to a semiconductor device and a method of fabricating the same that substantially obviates one or more problems due to limitations and disadvantages of the related art.

An object of the present invention is to provide a semiconductor device and a method of fabricating the same, which can improve reliability of a device by expanding a temperature range within which nickel silicide (NiSi) is formed and thus forming a good-quality nickel silicide layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method for fabricating a semiconductor device, including: forming a gate electrode on a substrate with a gate insulating layer interposed therebetween; forming insulating layer sidewalls at both sides of the gate electrode; forming source/drain regions in surface portions of the substrate that are located, respectively, at both sides of the gate electrode; forming a silicon layer on an entire surface of the substrate including the gate electrode;

forming a conductive layer on the entire surface of the substrate including the silicon layer; forming a silicide layer on the entire surface of the substrate by thermal-processing the substrate such that the conductive layer reacts with the silicon layer; and selectively removing the silicide layer that does not correspond to the gate electrode and the source/drain regions of the substrate.

In another aspect of the present invention, there is provided a semiconductor device including: a substrate defined into an active region and a device isolation region; a gate electrode formed on the active region of the substrate; a source and a drain formed by performing an impurity ion implantation process on the active region located at both sides of the gate electrode; and a silicide layer including a silicon monolayer and a conductive layer formed on the source and the drain, and the gate electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

FIGS. 2A to 2F are cross-sectional views illustrating a method of fabricating a semiconductor device according to the present invention.

Figure 1A:
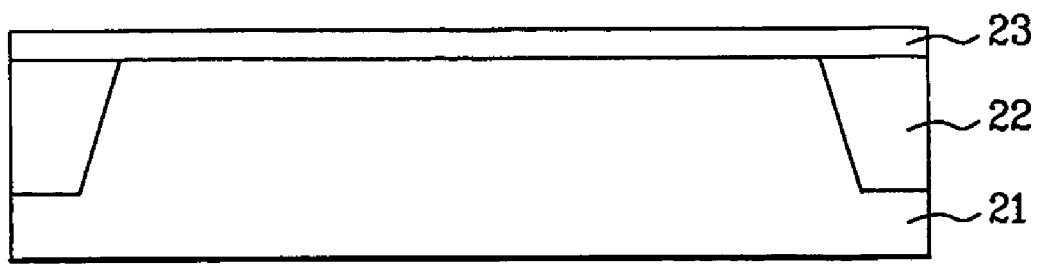
FIGS. 1A to 1F are cross-sectional views illustrating a method of fabricating the related art semiconductor device.
Figure 1B:
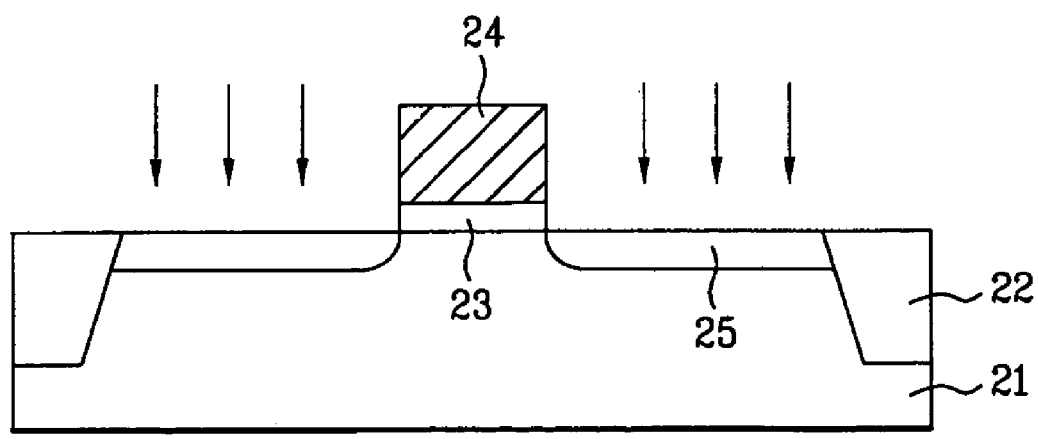
Figure 1C:
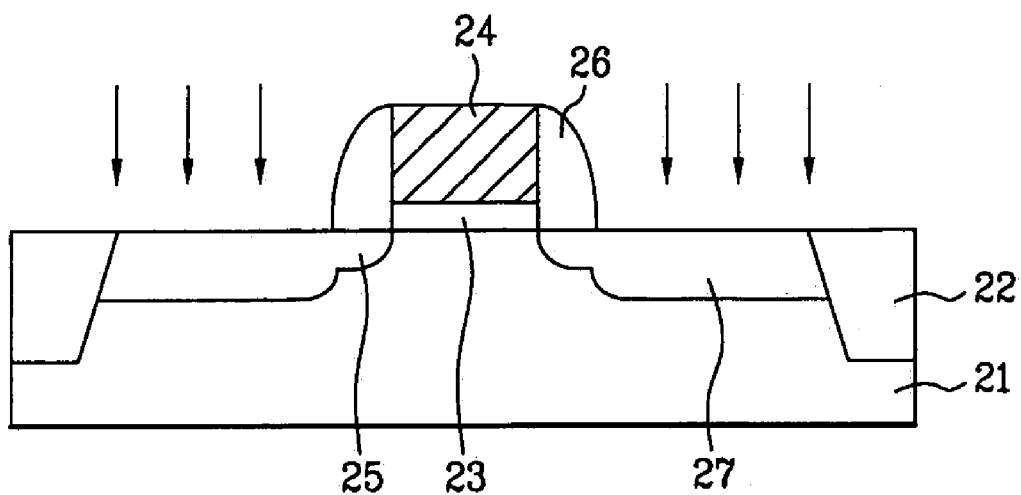
Figure 1D:
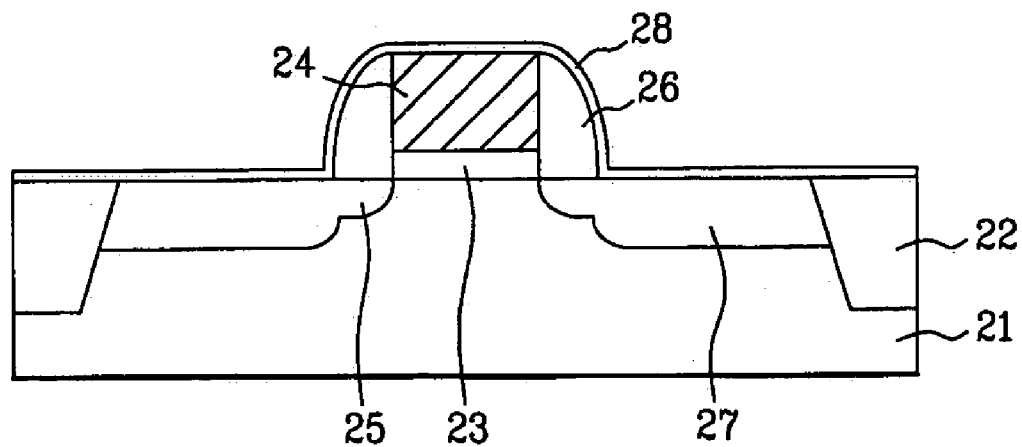
Figure 1E:
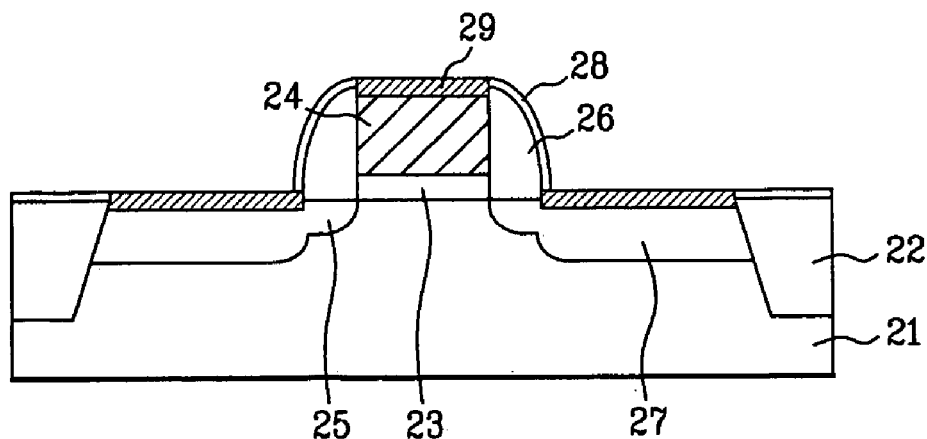
Figure 1F:
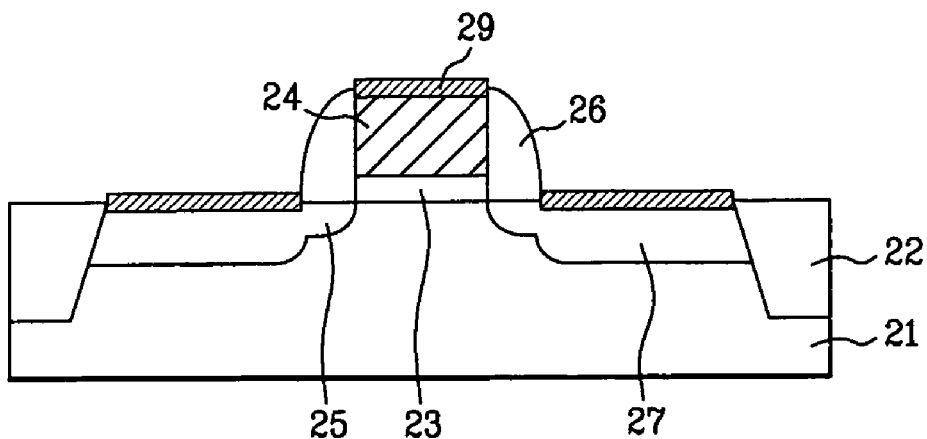
Figure 2A:
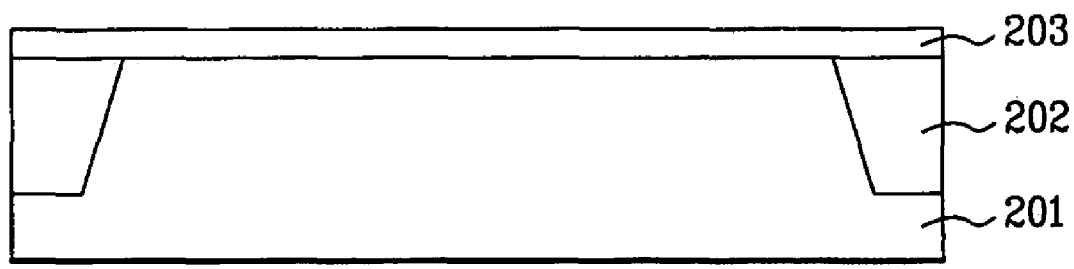
FIGS. 2A to 2F are cross-sectional views illustrating a method of fabricating a semiconductor device according to the present invention.

As illustrated in FIG. 2A, a semiconductor substrate 201 includes active regions and device isolation regions, and device isolation layers 202 are formed in the device isolation regions through a local oxidation of silicon (LOCOS) or shallow trench isolation (STI) process.

Then, the semiconductor substrate 201 is thermally oxidized at a high temperature to form a gate oxidation layer 203 on the semiconductor substrate 201.

Figure 2B:
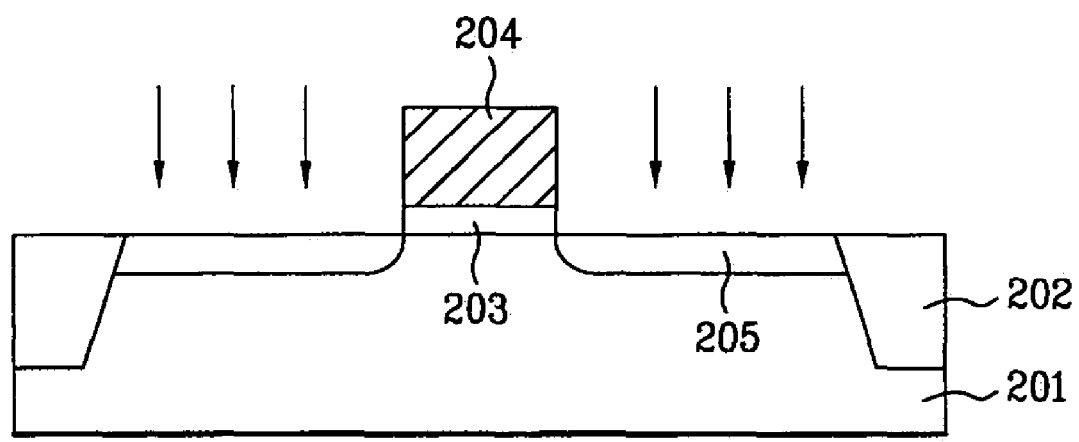

As shown in FIG. 2B, n-type or p-type impurity ions for forming a channel of a transistor are selectively implanted in the active region of the semiconductor substrate 201 to form an n-well or a p-well (not shown), and a thermal process is performed thereon at a high temperature of about 1050~1200° C.

Then, a polysilicon layer is deposited on the gate oxidation layer 203, and the polysilicon layer and the gate oxidation layer 203 are selectively etched through a photolithography process, to form a gate electrode 204.

N-type impurity ions or p-type impurity ions are implanted to an entire surface of the semiconductor substrate 201, using the gate electrode 204 as a mask, to form lightly doped drain (LDD) regions 205 at the surface portions of the semiconductor substrate 201 that are located, respectively, at both sides of the gate electrode 204.

Figure 2C:
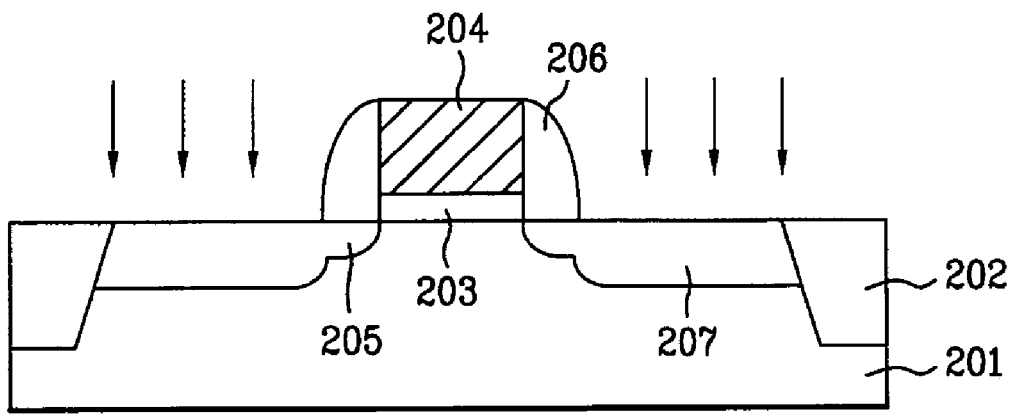

As shown in FIG. 2C, an insulating layer is deposited on an entire surface of the semiconductor substrate 201 by a low pressure chemical vapor deposition (LPCVP) method, and then an etch-back process is performed on the entire surface thereof to form insulating layer sidewalls 206 at both sides of the gate electrode 204.

Then, n-type or p-type high-concentration impurity ions are implanted to the entire surface of the semiconductor substrate 201 using the gate electrode 204 and the insulating layer sidewalls 206 as a mask, to form source-drain impurity regions 207 in surface portions of the semiconductor substrate 201 that are located, respectively, at both sides of the gate electrode 204, and then a thermal process is performed thereon at a temperature of about 1000~1050° C.

Figure 2D:
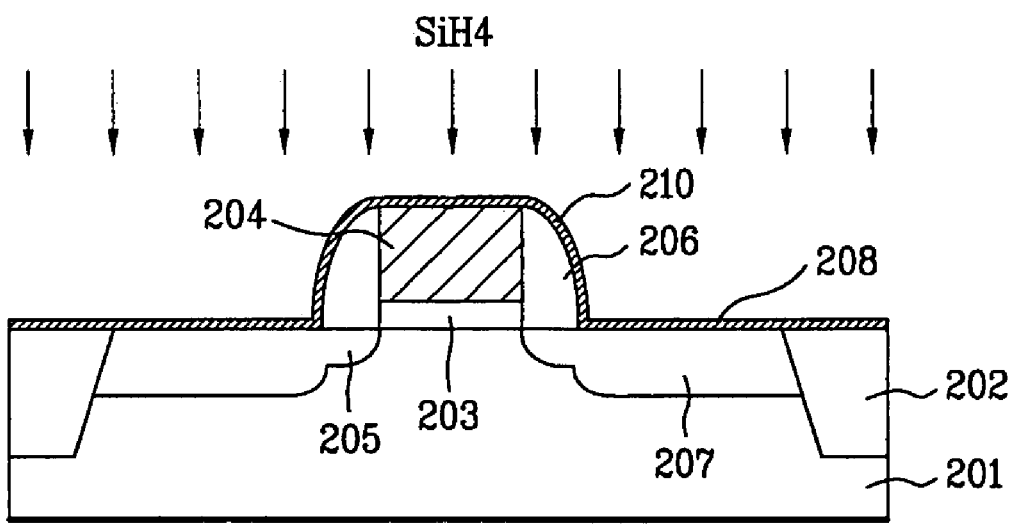

As shown in FIG. 2D, a washing process is performed to remove from the semiconductor substrate 201 various target materials such as metal impurities, organic contaminants, natural oxidation layer.

The washing process is a chemical washing process using an SC1 solution (Standard Cleaning: an organic material obtained by mixing $NH_4OH$, $H_2O_2$, $H_2O$ at a ratio of 1:4:20), an HF or DHF (Dilute HF) solution.

Then, the semiconductor substrate 201 having completely passed through the washing process is heated to an about 250~400° C., for example, to about 350° C. A SiH4 gas is injected onto the heated semiconductor substrate 201, thereby forming a silicon (Si) layer 208, which is a monolayer.

The gas to form the silicon monolayer is not limited to $SiH_4$, but any type of gas including Si that is not overly stable (because overly stable Si does not react with Ni (nickel)) may be used.

Figure 2E:
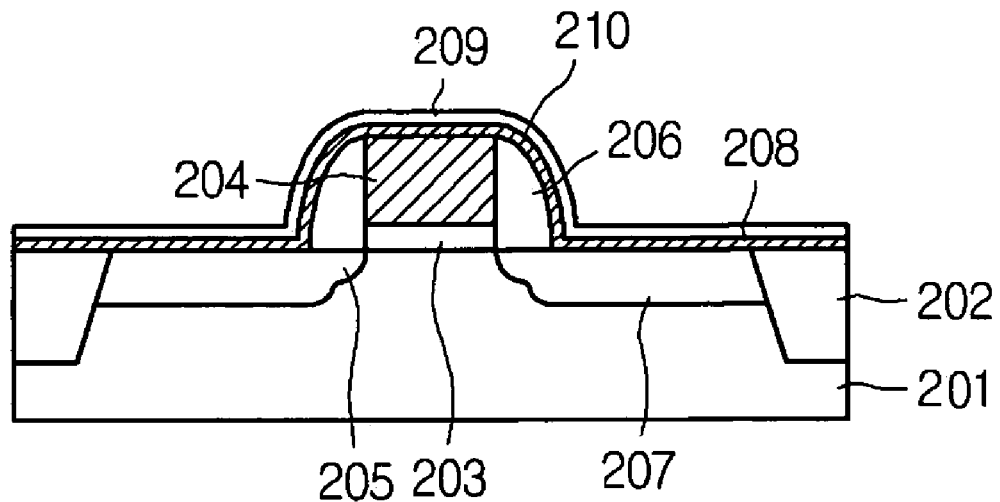

As illustrated in FIG. 2E, a nickel layer 209 is formed on the silicon layer 208 by physical vapor deposition (PVD) or chemical vapor deposition (CVD).

A capping layer of Ti, TiN or Ti/TiN may be formed on the nickel layer 209.

The nickel layer 209 has a thickness of 50~300 Å. Ti or TiN that is used to form the capping layer on the nickel layer 209 is deposited to a thickness of 100~400 Å at a deposition temperature of 100~300° C.

Although the nickel layer 209 is described in the present invention, one material selected from the group consisting of cobalt, titanium, tungsten, tantalum, molybdenum, and the like may be used.

Figure 2F:
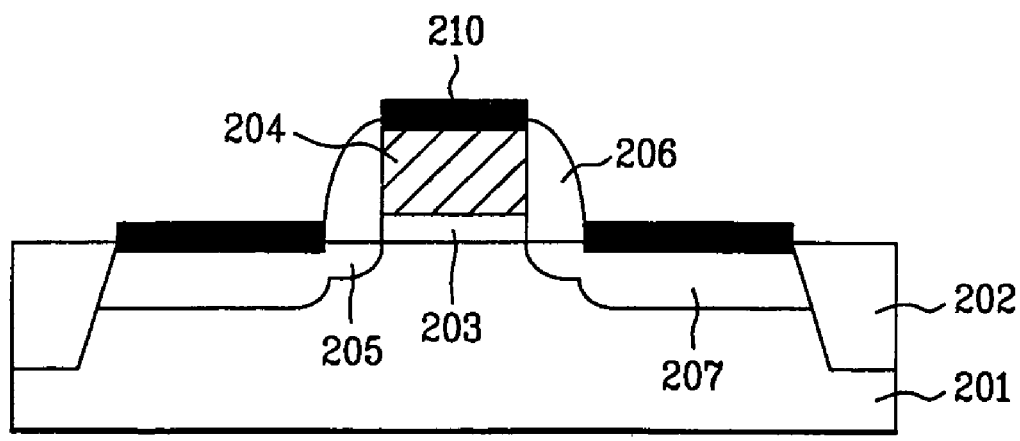

As illustrated in FIG. 2F, a thermal process is performed on the semiconductor substrate 201 at a temperature of 300~500° C. for 10 seconds to 2 minutes, thereby forming a nickel silicide (NiSi) layer 210 on the semiconductor substrate 201 including the gate electrode 204 and the source/drain impurity regions 207.

In the related art, metal ions of a metal layer react with silicon ions of a gate electrode and a semiconductor substrate by a thermal process to form a nickel silicide layer. However, in the present invention, silicon ions of the silicon layer 208 formed on the gate electrode 204 and the semiconductor substrate 201 react with metal ions of the nickel layer 209 to form the nickel silicide layer 210.

That is, in the related art, $Ni_2Si$ or $NiSi_2$ is made at a temperature around a range of 400° C.±10° C. because of a shortage of a temperature margin. Here, 400° C. is a reference temperature at which NiSi is formed.

In the related art, Ni and Si of the gate electrode 24 and the source/drain regions react with each other to form a nickel silicide in a surface of the gate electrode 24 and in a surface of the source/drain regions. However, in the present invention, the independent nickel silicide layer is formed on a surface of the gate electrode 204 and on a surface of the source/drain regions, and a portion of the nickel silicide layer is formed into the surface of the gate electrode 204 and the surface of the source/drain regions.

Thus, it is important to make NiSi, not Ni$_2$Si in a low temperature range. To this end, Ni and Si are combined at a ratio of 1:1.

Because the silicon layer 208 is formed on the semiconductor substrate 201 using SiH$_4$ according to the present invention, NiSi can be obtained even at a low temperature. Thus, the temperature range within which NiSi is made can be greatly increased.

Then, the nickel silicide layer (209) that does not correspond to the gate electrode and the source/drain regions of the semiconductor substrate is removed by wet etching, selectively.

As described so far, the method of fabricating a semiconductor device according to the present invention has the following effect.

In the present invention, a silicon layer is formed on a semiconductor layer using SiH$_4$, and reacts with a nickel layer, so that a good-quality nickel silicide can be obtained even at a low temperature. Thus, a temperature range where nickel silicide is formed may be greatly increased.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating a semiconductor device, the method comprising:
   forming a gate insulating layer and a gate electrode on a substrate;
   forming insulating layer sidewalls at sides of the gate electrode;
   forming source/drain regions in surface portions of the substrate that are located, respectively, at opposed sides of the gate electrode;
   forming a silicon layer on an entire surface of the substrate including the gate electrode by injecting a gas that includes silicon into a chamber;
   forming a conductive layer on the entire surface of the substrate including the silicon layer;
   forming a conductive silicide layer on the entire surface of the substrate by thermal-processing the substrate such that the conductive layer reacts with the silicon layer; and
   selectively removing the silicide layer that does not correspond to the gate electrode and the source/drain regions of the substrate.

2. The method according to claim 1, wherein the gas that includes silicon comprises SiH$_4$.

3. The method according to claim 1, further comprising, before forming the silicon layer, heating the substrate to a temperature of 250~400° C.

4. The method according to claim 1, wherein the silicon layer is formed at a deposition temperature of about 350°.

5. The method according to claim 1, wherein the conductive layer has a thickness of 50~300 Å.

6. The method according to claim 3, further comprising, before forming the silicon layer, heating the substrate to about 350° C.

7. The method according to claim 1, wherein the thermal processing is performed at a temperature of 300~500° C.

8. The method according to claim 7, wherein the thermal processing is performed for a time of from 10 seconds to about 2 minutes.

9. The method according to claim 1, wherein the conductive layer is formed at a temperature of 100~300° C.

10. The method according to claim 1, further comprising forming a capping layer comprising Ti, TiN, or a Ti/TiN bilayer on the conductive layer.

11. The method according to claim 10, wherein the capping layer has a thickness of 100~400 Å.

12. The method according to claim 1, wherein the conductive layer comprises a material selected from the group consisting of nickel, cobalt, titanium, tungsten, tantalum, and molybdenum.

13. The method according to claim 12, wherein the conductive silicide layer comprises Nickel (Ni) and Silicon (Si) in a ratio of about 1:1.

14. The method of claim 1, wherein the gate electrode comprises polysilicon.

15. The method of claim 1, wherein forming the insulating layer sidewalls comprises depositing an insulating material on an entire surface of the substrate, the selectively etching the insulating material.

16. The method of claim 1, wherein forming the source/drain regions comprises implanting n-type or p-type impurities in surface portions of the substrate that are located, respectively, at opposed sides of the gate electrode.

17. The method of claim 16, wherein forming the source/drain regions further comprises thermal processing at a temperature of about 1000-1050° C. after implanting n-type or p-type impurities.

18. The method of claim 1, further comprising after forming the gate electrode and insulating sidewalls, washing with SC1 solution, HF solution, or DHF solution.

19. The method of claim 1, wherein forming the conductive layer comprises depositing a conductive material by physical vapor deposition (PVD) or chemical vapor deposition (CVD).

20. The method of claim 1, wherein selectively removing the silicide layer comprises wet etching the silicide layer.

* * * * *